United States Patent
Yoon et al.

(10) Patent No.: US 9,666,887 B2
(45) Date of Patent: May 30, 2017

(54) METHOD FOR DIAGNOSING CURRENT SENSOR OF FUEL CELL SYSTEM

(71) Applicant: HYUNDAI MOTOR COMPANY, Seoul (KR)

(72) Inventors: Sung Gone Yoon, Suwon-si (KR); Kyung Won Suh, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 90 days.

(21) Appl. No.: 14/842,809

(22) Filed: Sep. 1, 2015

(65) Prior Publication Data
US 2016/0126573 A1    May 5, 2016

(30) Foreign Application Priority Data

Nov. 3, 2014 (KR) .................. 10-2014-0151125

(51) Int. Cl.
| | | |
|---|---|---|
| G01R 31/00 | (2006.01) |
| H01M 8/04664 | (2016.01) |
| G01R 19/00 | (2006.01) |
| G01R 35/00 | (2006.01) |
| H01M 8/0438 | (2016.01) |
| H01M 8/04537 | (2016.01) |

(52) U.S. Cl.
CPC .... *H01M 8/04686* (2013.01); *G01R 19/0092* (2013.01); *G01R 35/00* (2013.01); *H01M 8/04388* (2013.01); *H01M 8/04589* (2013.01)

(58) Field of Classification Search
USPC ............................................. 324/537, 76.11
See application file for complete search history.

(56) References Cited

U.S. PATENT DOCUMENTS

2010/0291447 A1* 11/2010 Imanishi ........... H01M 8/04268
429/429

FOREIGN PATENT DOCUMENTS

| JP | 2006-202555 A | 8/2006 |
|---|---|---|
| JP | 2006-351408 A | 12/2006 |
| JP | 2012-248522 A | 12/2012 |
| JP | 2013-106408 A | 5/2013 |
| JP | 2013-187108 A | 9/2013 |

\* cited by examiner

*Primary Examiner* — Vincent Q Nguyen
(74) *Attorney, Agent, or Firm* — McDermott Will & Emery LLP

(57) ABSTRACT

A method for diagnosing a current sensor of a fuel cell system includes calculating an estimated duty value of a hydrogen pressure control valve, corresponding to a sensing value of the current sensor, while operating the fuel cell system. The estimated duty value is compared with an actual duty value where the hydrogen pressure control valve is controlled during the operation of the fuel cell system, thereby calculating an error value between the estimated duty value and the actual duty value. The error value is compared with a critical value in a normal range, thereby determining whether a failure occurs in the current sensor. The hydrogen pressure control valve controls a pressure of hydrogen supplied to a fuel cell stack of the fuel cell system.

14 Claims, 8 Drawing Sheets

-- Related Art --

-- Related Art --

-- Related Art --

(In occurrence of scaling trouble)

METHOD FOR DIAGNOSING CURRENT SENSOR OF FUEL CELL SYSTEM

CROSS-REFERENCE TO RELATED APPLICATION

This application claims under 35 U.S.C. §119(a) the benefit of priority to Korean Patent Application No. 10-2014-0151125 filed Nov. 3, 2014, the entire content of which is incorporated herein by reference.

TECHNICAL FIELD

The present disclosure relates to a method for diagnosing a current sensor. More particularly, the present disclosure relates to a method for diagnosing a failure of a current sensor which senses a stack current in a fuel cell system.

BACKGROUND

A fuel cell system of a hydrogen fuel cell includes a fuel cell stack for generating electrical energy from an electrochemical reaction between reaction gases (hydrogen and oxygen). A hydrogen supply device supplies hydrogen that is a fuel to the fuel cell stack, and an air supply device supplies air including oxygen that is an oxidizer to the fuel cell stack. A heat and water management system controls an operating temperature of the fuel cell stack and performs a water management function. A fuel cell system controller is configured to control all operations of the fuel cell system.

In general, the hydrogen supply device includes a hydrogen storage (hydrogen tank), a regulator, a hydrogen pressure control valve, a pressure sensor, a hydrogen recirculation device, and the like. The air supply device includes an air blower, a humidifier, and the like. The heat and water management system includes an electric water pump (cooling water pump), a water tank, a radiator, and the like.

The hydrogen tank of the hydrogen supply device supplies high-pressure hydrogen which is decompressed in the regulator and then supplied to the fuel cell stack. The amount of the decompressed hydrogen supplied to the fuel cell stack is controlled through a pressure control according to operating conditions of the fuel cell stack.

That is, the hydrogen passing through the regulator is pressure-controlled by the hydrogen pressure control valve and then supplied to the fuel cell stack. The hydrogen pressure control valve adjusts the pressure of the hydrogen decompressed by the regulator to be suitable for the operating conditions of the fuel cell stack. The supply amount of the hydrogen is controlled through hydrogen supply pressure control using the hydrogen pressure control valve.

The remaining hydrogen after the reaction in the fuel cell stack is discharged through an anode outlet of the fuel cell stack or recirculated through an anode inlet of the fuel cell stack by the hydrogen recirculation device.

The hydrogen recirculation device has various forms according to a recirculation method including a method using an ejector, a method using a recirculation blower, a method using together an ejector and a recirculation blower, and the like. The hydrogen recirculation device recirculates, to an anode of the fuel cell stack, the remaining non-reaction hydrogen after the hydrogen is used at the anode, thereby reusing the hydrogen.

In the fuel cell stack, as foreign substances such as nitrogen, water, and steam moved to the anode through an electrolytic membrane in the fuel cell stack increase, the amount of hydrogen in the anode decreases, and hence reaction efficiency of the fuel cell stack decreases. In this regard, a hydrogen purge valve is opened to purge the hydrogen for a predetermined period of time.

That is, the hydrogen purge valve for the hydrogen purging is installed between the anode outlet of the fuel cell stack to discharge the hydrogen of the anode periodically. Thus, the foreign substances such as nitrogen and water are discharged and removed together with the hydrogen, and efficiency of the fuel cell stack increases.

When the foreign substances in the fuel cell stack are discharged as described above, hydrogen concentration and utilization of hydrogen are increased, and gas diffusivity and reactivity are improved.

A fuel cell vehicle comprises an electric motor as a driving source for driving the vehicle and an inverter for converting a DC voltage of the fuel cell stack and a battery into an AC voltage to drive the electric motor.

FIG. 1 is a view illustrating a current sensor for sensing a stack current between a fuel cell stack and a system load according to the related art. Referring to FIG. 1, a current sensor 2 for sensing a current output from a fuel cell stack 1 is installed in a fuel cell system.

The current sensor 2 senses a current from the fuel cell stack 1 and sends to a system load 3 which includes an auxiliary machinery such as an air blower, an electric water pump, a recirculation blower or a radiator fan, an inverter, or the like. The stack current sensed by the current sensor 2 is input to a controller to be widely used in various system controls for a vehicle, including stack operation, auxiliary machinery operation, inverter (motor) driving control, and the like.

As described above, the current sensor is a main sensor for sensing a stack current (current consumed by a load) used as a variable in control of various systems of the vehicle including the fuel cell system. In a failure of the current sensor, a system malfunction occurs, and therefore, a logic for diagnosing a failure of the current sensor is applied to the vehicle.

When the failure of the current sensor is detected through a failure diagnosis logic, the fuel cell system immediately shuts down.

FIG. 2 is a view illustrating a process of shutting down a fuel cell system after a failure of a current sensor is diagnosed in a conventional art. A controller determines whether a pressure control of hydrogen supplied to a fuel cell stack is abnormal based on a sensing value of a pressure sensor during the operation of the fuel cell system (S1). The controller, according to a predetermined failure diagnosis logic, diagnoses a disconnection/short-circuit failure of the current sensor (S2), and diagnoses a performance failure of the current sensor (S3).

The controller immediately shuts down the fuel cell system in the determination of an abnormality (over-pressure/low pressure) of the pressure control of the hydrogen or a disconnection/short-circuit failure of the current sensor, or the determination of the performance failure of the current sensor, in which the sensing value of the current sensor is represented as a negative value (S4).

FIG. 3 is a view illustrating a failure diagnosis possible region and a failure diagnosis impossible region in an output of the current sensor according to the conventional art.

As shown in FIG. 3, a controller evaluates a current value by reading an output voltage of a current sensor. A disconnection region, in which a short circuit or a sensor performance failure is determined, exists in a sensing region of the current sensor, but a failure diagnosis impossible region also exists widely.

That is, a scaling failure having an error at a constant rate compared with an actual value, an offset failure having an error with a constant value compared with an actual value, a stuck failure where a sensing value of the current sensor is fixed to a certain value, or the like may exist even when the output of the current sensor is within a normal range. Although the current value, which has a deviation compared with the actual current value, is detected when such a failure occurs, it is impossible to sense the current value.

As a result, malfunction occurs in the various systems in the vehicle, including the fuel cell system, due to sensing a failure. Particularly, an error occurs in air supply control, cooling control, hydrogen purge and recirculation control, or the like, which depends on a sensing value of the current sensor.

SUMMARY OF THE DISCLOSURE

The present disclosure provides a method for diagnosing a failure of a current sensor in a fuel cell system, including a scaling failure, an offset failure, a stuck failure, and the like, which are shown in a normal output range of the current sensor, and the failure can be diagnosed as well as a disconnection failure, a short-circuit failure, and a sensor performance failure, which are shown in the conventional art.

According to an exemplary embodiment of the present inventive concept, a method for diagnosing a current sensor of a fuel cell system includes calculating an estimated duty value of the hydrogen pressure control valve, corresponding to a sensing value of the current sensor, while operating the fuel cell system. The estimated duty value is compared with an actual duty value where the hydrogen pressure control valve is controlled during the operation of the fuel cell system, and an error value between estimated duty value and the actual duty value is calculated. The error value is compared with a critical value in a normal range, thereby determining whether a failure occurs in the current sensor. The hydrogen pressure control valve controls a pressure of hydrogen supplied to a fuel cell stack of the fuel cell system.

According to another exemplary embodiment of the present inventive concept, a method for diagnosing a current sensor of a fuel cell system includes calculating an estimated current sensor value corresponding to a duty value where the hydrogen pressure control valve is controlled during operation of the fuel cell system. The estimated current sensor value is compared with an actual sensing value sensed by the current sensor during the operation of the fuel cell system, thereby calculating an error value between the estimated current sensor value and the actual sensing value. The error value is compared with a critical value in a normal range, thereby determining whether a failure occurs in the current sensor. The hydrogen pressure control valve controls a pressure of hydrogen supplied to a fuel cell stack of the fuel cell system Other aspects and exemplary embodiments of the inventive concept are discussed infra.

According to the method of the present disclosure, it is possible to diagnosis a failure of the current sensor using a duty value of the hydrogen pressure control valve in the failure diagnosis impossible region of the existing current sensor, in addition to the disconnection failure, the short-circuit failure, and the performance failure. Further, it is possible to prevent a malfunction of the fuel cell system and to improve the stability of the fuel cell system.

Further, it is possible to perform an emergency operation without shutting down the fuel cell system even when a failure occurs in the current sensor.

BRIEF DESCRIPTION OF THE DRAWINGS

The above and other features of the present inventive concept will now be described in detail with reference to certain exemplary embodiments thereof illustrated the accompanying drawings which are given hereinbelow by way of illustration only, and thus are not limitative of the present disclosure.

Figure 1:
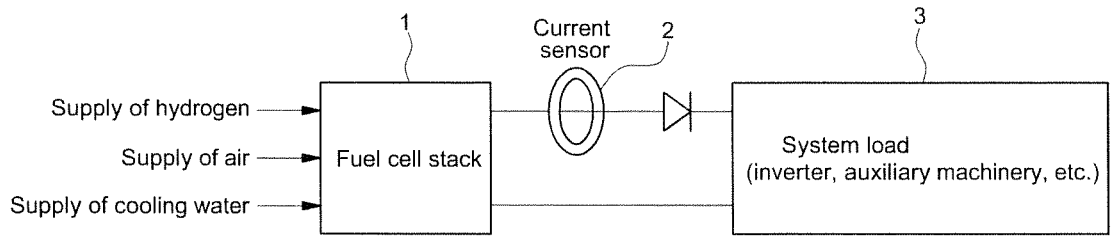
FIG. 1 is a view illustrating a current sensor for sensing stack current between a fuel cell stack and a system load according to the related art.
Figure 2:
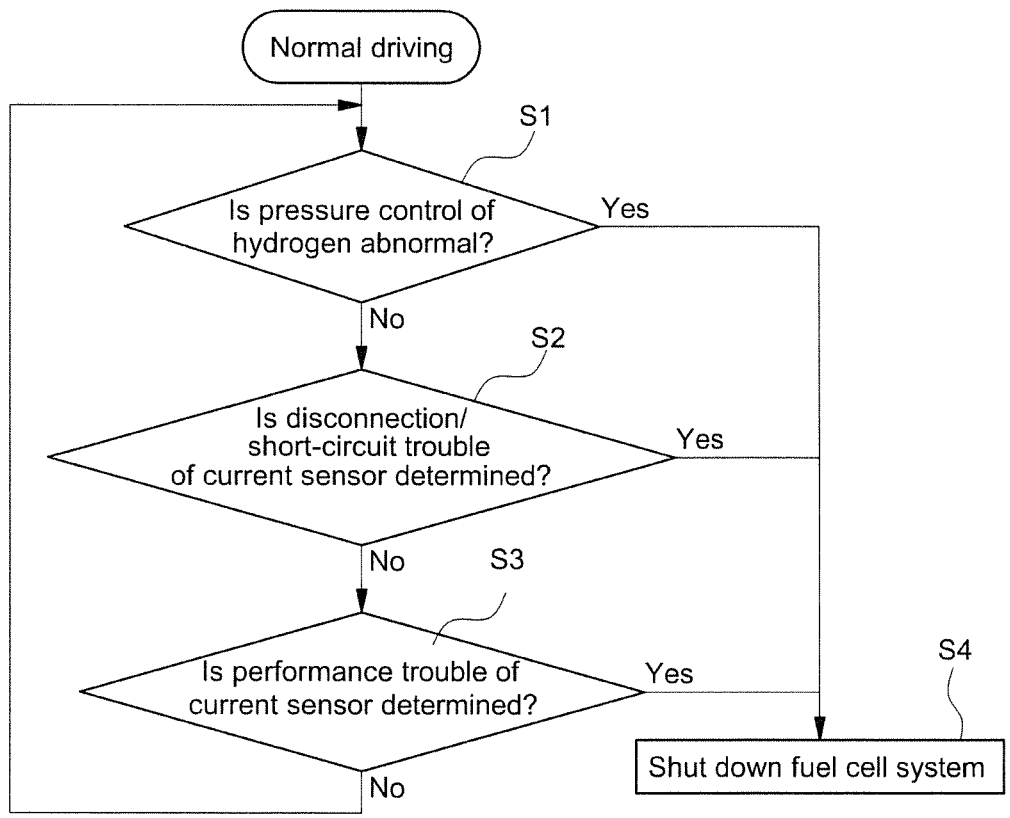
FIG. 2 is a view illustrating a process of shutting down a system after a failure of a current sensor is diagnosed according to the related art.
Figure 3:
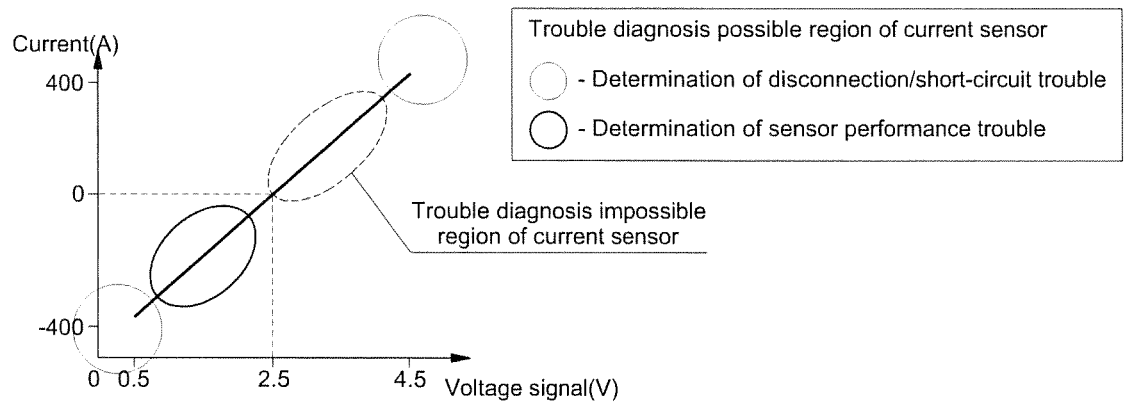
FIG. 3 is a view illustrating an output of a current sensor and a failure diagnosis possible region and a failure diagnosis impossible region of a current sensor according to the related art.

It should be understood that the appended drawings are not necessarily to scale, presenting a somewhat simplified representation of various features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

Hereinafter reference will now be made in detail to various embodiments of the present inventive concept, examples of which are illustrated in the accompanying drawings and described below. While the disclosure will be described in conjunction with exemplary embodiments, it will be understood that present description is not intended to limit the disclosure to those exemplary embodiments. On the contrary, the disclosure is intended to cover not only the exemplary embodiments, but also various alternatives, modifications, equivalents, and other embodiments, which may be included within the spirit and scope of the invention as defined by the appended claims.

The present disclosure provides a method for diagnosing a failure of a current sensor in a fuel cell system, in which a scaling failure, an offset failure, a stuck failure, and the like can be diagnosed as well as a disconnection failure, a short-circuit failure and a sensor performance failure.

Figure 4:
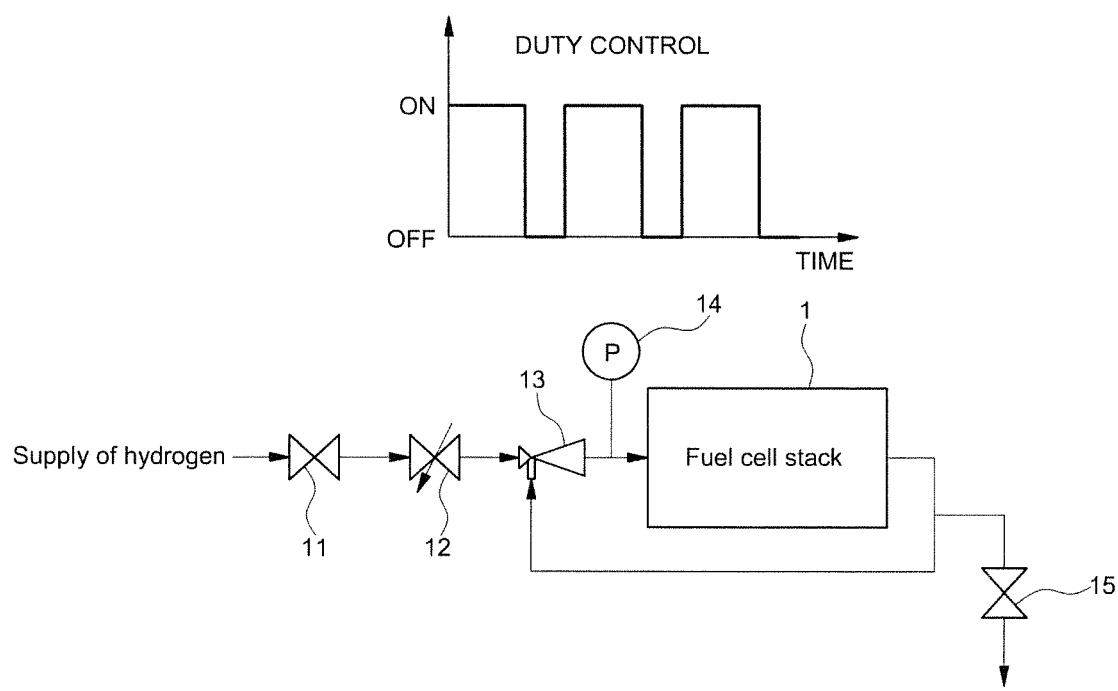
FIG. 4 is a schematic view illustrating a hydrogen supply device of a fuel cell system according to the present disclosure.
Figure 5:
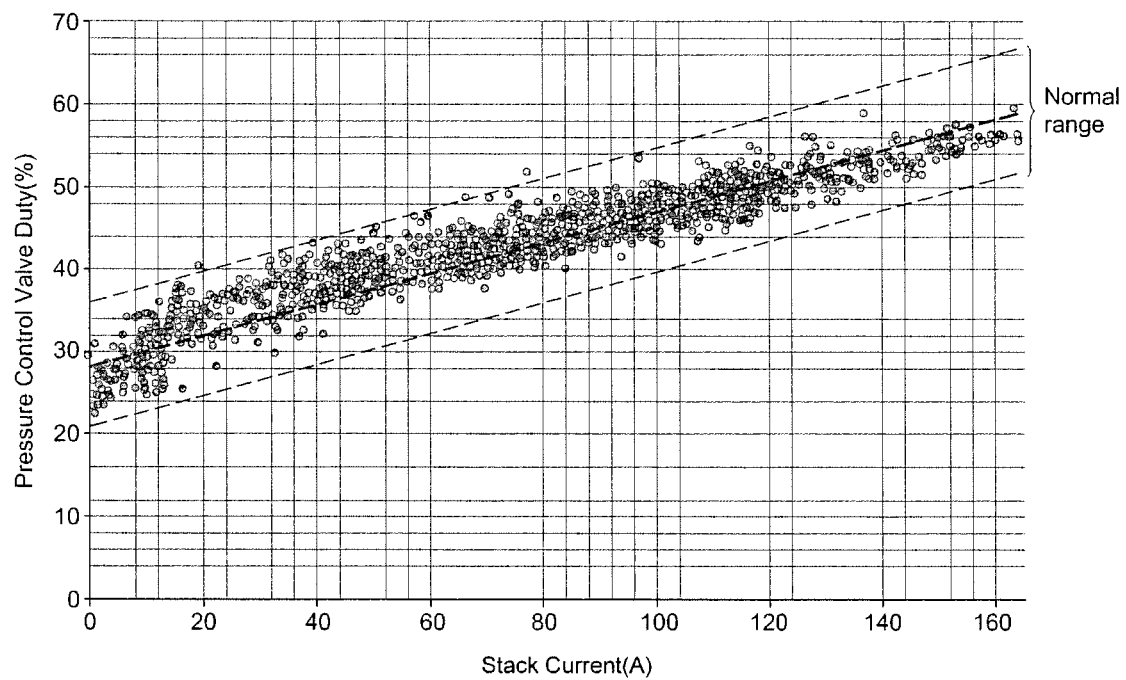
FIG. 5 is a graph illustrating a correlation between system load consumption currents (stack currents) and duty values of a hydrogen pressure control valve according to the present disclosure.

FIG. 4 is a schematic view illustrating a hydrogen supply device of a fuel cell system according to the present disclosure. FIG. 5 is a graph illustrating a correlation between fuel cell consumption currents (stack currents) and duty values of a hydrogen pressure control valve according to the present disclosure.

Referring to FIG. 4, a hydrogen storage (hydrogen tank), a regulator, and the like among components of a hydrogen supply device is omitted. A hydrogen supply device of a fuel cell system according to the present disclosure includes a shut-off valve 11 for selectively supplying hydrogen to a fuel cell stack 1 or cutting off the supply of the hydrogen to the fuel cell stack 1. A hydrogen pressure control valve 12 controls the supply pressure of the hydrogen. An ejector 13 recirculates the hydrogen, and a pressure sensor 14 detects a pressure of the hydrogen supplied to the fuel cell stack 1. A hydrogen purge valve 15 discharges and removes foreign substances such as nitrogen and water from the fuel cell stack 1.

In the hydrogen supply device according to the present disclosure, a controller is configured to duty-control the hydrogen pressure control valve 12 in order to control the pressure of an anode in the fuel cell stack 1. In general, if a stack current is consumed by a system load, a duty value for driving control of the hydrogen pressure control valve 12 linearly increases in proportion to the consumption amount of the stack current.

FIG. 5 is a view illustrating such a correlation between stack currents that are current sensor values in a normal range and duty values of the hydrogen pressure control valve.

In the present disclosure, a scaling failure, an offset failure, a stuck failure, or the like of the current sensor is diagnosed using the fact that a correlation exists between the stack currents (sensor values) and the duty values.

Figure 6:
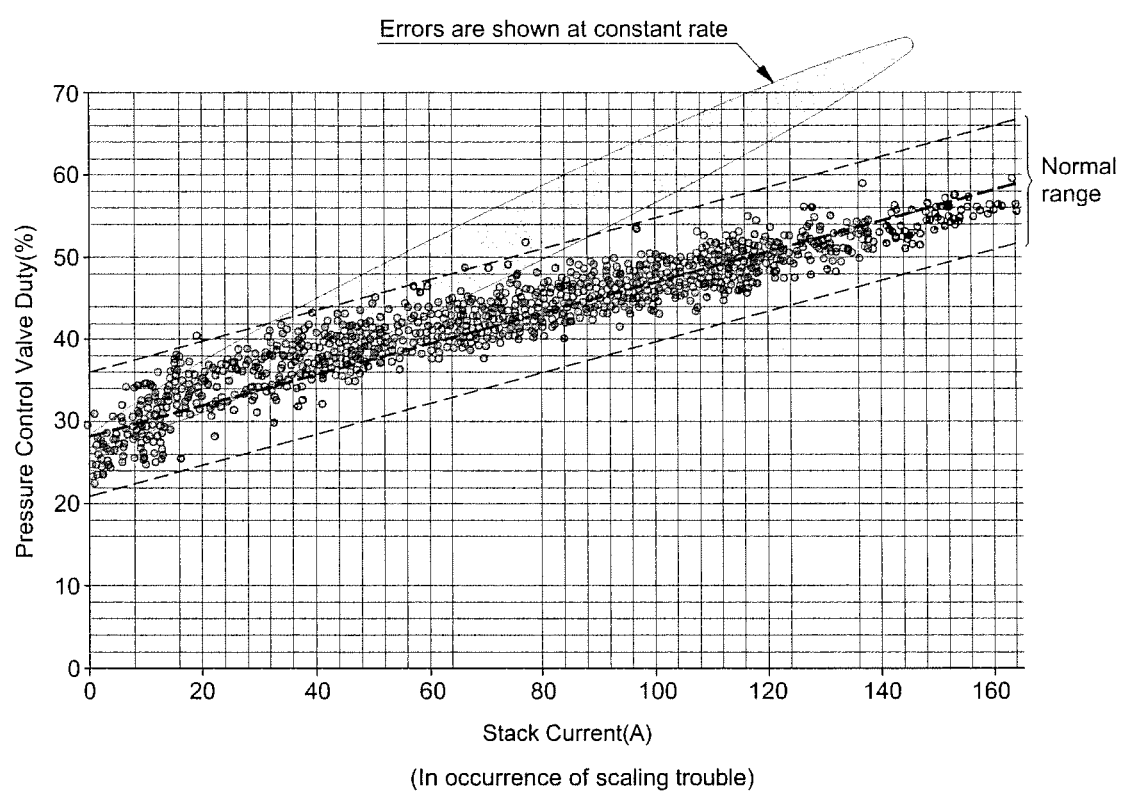
FIG. 6 is a graph illustrating a correlation between stack currents when a scaling failure of a current sensor and duty values of the hydrogen pressure control valve according to the present disclosure.
Figure 7:
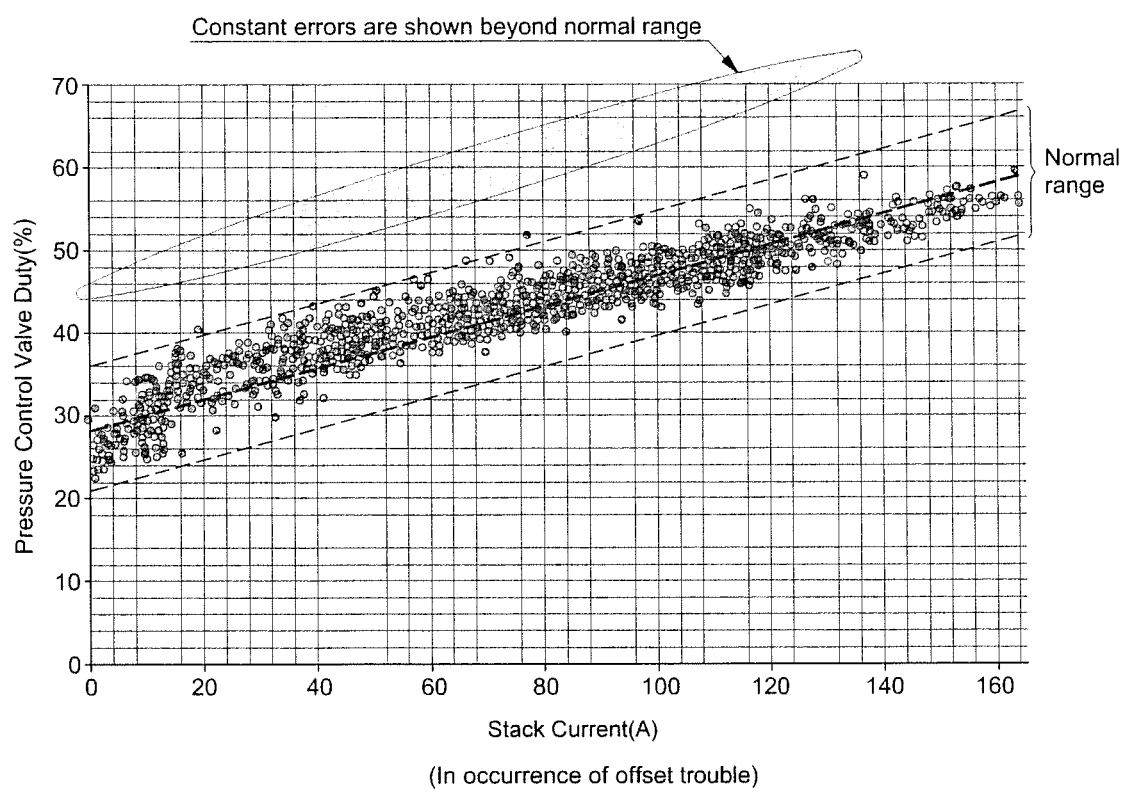
FIG. 7 is a graph illustrating a correlation between stack currents when an offset failure of a current sensor and duty values of a hydrogen pressure control valve according to the present disclosure.
Figure 8:
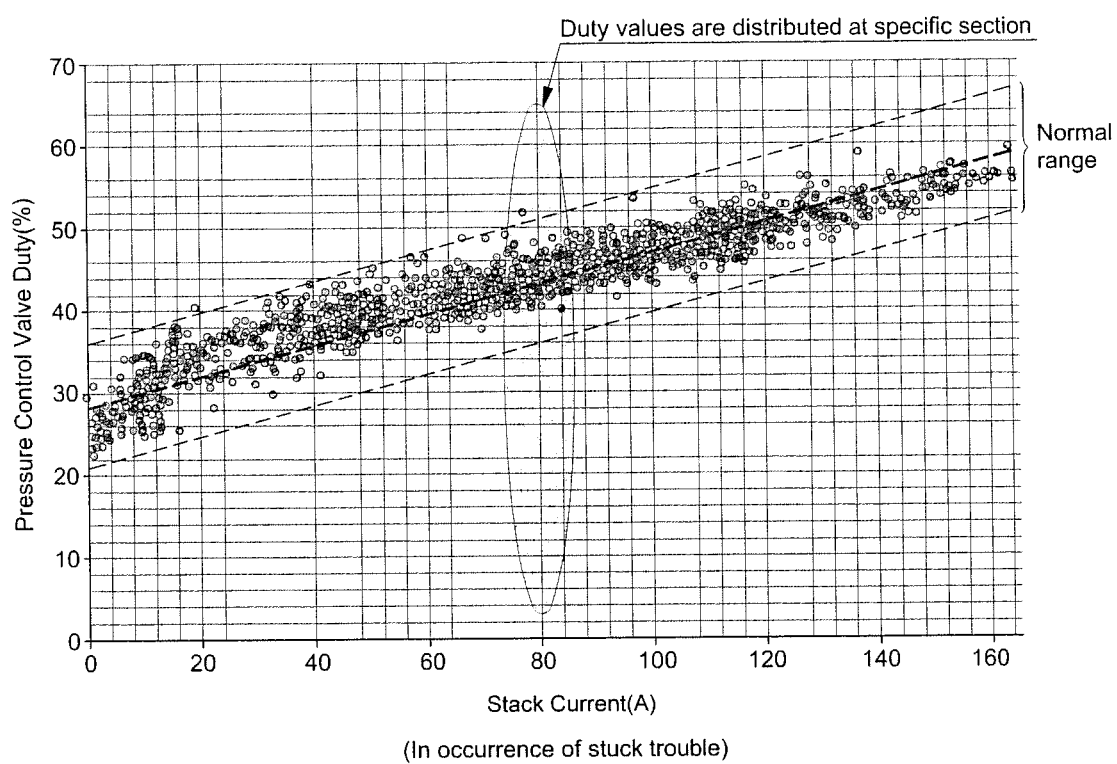
FIG. 8 is a graph illustrating a correlation between stack currents when a stuck failure of a current sensor and duty values of a hydrogen pressure control valve according to the present disclosure.

FIG. 6 is a graph illustrating a correlation between stack currents when a scaling failure of a current sensor (X-axis, sensing values of the current sensor) and duty values of a hydrogen pressure control valve (Y-axis, actual duty values of the hydrogen pressure control valve). FIG. 7 is a graph illustrating a correlation between stack currents when an offset failure of a current sensor and duty values of a hydrogen pressure control valve. FIG. 8 is a graph illustrating a correlation between stack currents when a stuck failure of a current sensor and duty values of a hydrogen pressure control valve.

Referring to FIG. 6, in duty values in a scaling failure, errors are shown at a constant rate, as compared with duty values when the current sensor is normal, referring to FIG. 7, in duty values in an offset failure, constant errors are shown beyond a normal range, as compared with the duty values when the current sensor is normal, and referring to FIG. 8, in duty values in a stuck failure, the duty values are distributed in a specific current section, unlike the duty values when the current sensor is normal.

Therefore, when the scaling failure, the offset failure, the stuck failure, or the like occurs in the current sensor, the actual duty value of the hydrogen pressure control valve is different from the current duty value (corresponding to an estimated duty value which will be described later).

In the present disclosure, the failure diagnosis of the current sensor is performed by identifying whether there exists a difference between a duty value of the hydrogen pressure control valve, which is estimated from a sensing value (output value) of the current sensor, and a duty value where the hydrogen pressure control value is actually controlled.

Hereinafter, during operation of the fuel cell system, the duty value estimated from the sensing value of the current sensor will be referred to as an estimated duty value, and the duty value where the hydrogen pressure control valve is actually controlled will be referred to as an actual duty value.

In the present disclosure, the estimated duty value is evaluated from a duty map in which duty values of the hydrogen pressure control valve are set according to current sensor values. The actual duty value is a duty value (or duty feedback value) that the controller uses for driving control of the hydrogen pressure control valve during the operation of the fuel cell system. Therefore, the actual duty value is stored in the controller.

The duty map may be made by previously evaluating a duty value where the hydrogen pressure control valve is controlled for each sensing value (stack current) of a normal current sensor without any failure in a fuel cell system having the same specification and then setting a duty value corresponding to the current value.

Alternatively, the estimated duty value may be evaluated by obtaining the following relational expression from duty value data for each current senor value to be input to the controller and then by inputting a sensing value (output value) of the current sensor as a current sensor value of the following relational expression in an actual failure diagnosis process.

$$\text{Estimated duty value} = \alpha \times \text{sensing value of current sensor} + \beta$$

Here, the slope $\alpha$ and the intercept $\beta$ are evaluated from prior test under a condition where the current sensor is normal. If a sensing value of the current sensor is input in a state in which the relational expression is stored in the controller, the estimated duty value may be evaluated in real time from the relational expression.

Figure 9:
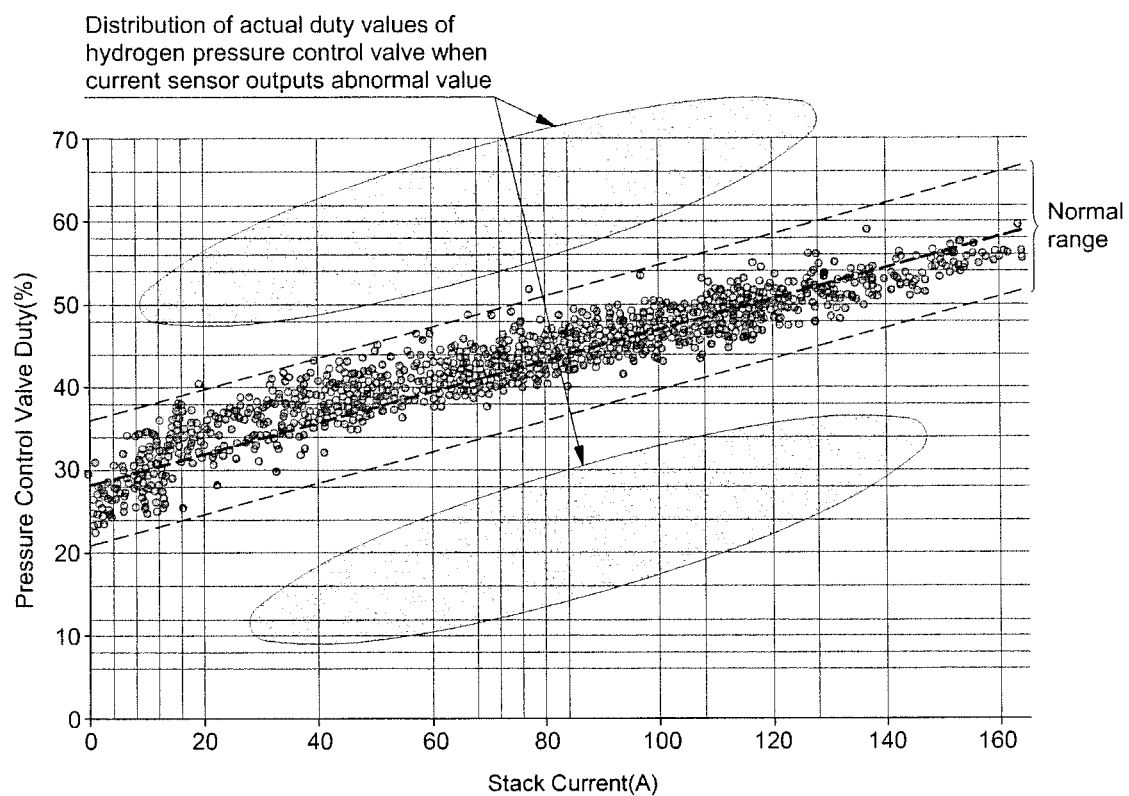
FIG. 9 is a graph illustrating a distribution of actual duty values of a hydrogen pressure control valve when a current sensor outputs an abnormal value together with a distribution of duty values when a current sensor outputs a normal value according to the present disclosure.

FIG. 9 illustrates a distribution of actual duty values of a hydrogen pressure control valve when a current sensor outputs an abnormal value due to occurrence of a scaling failure, an offset failure, a stuck failure, or the like together with a distribution of duty values when the current sensor outputs a normal value.

Figure 10:
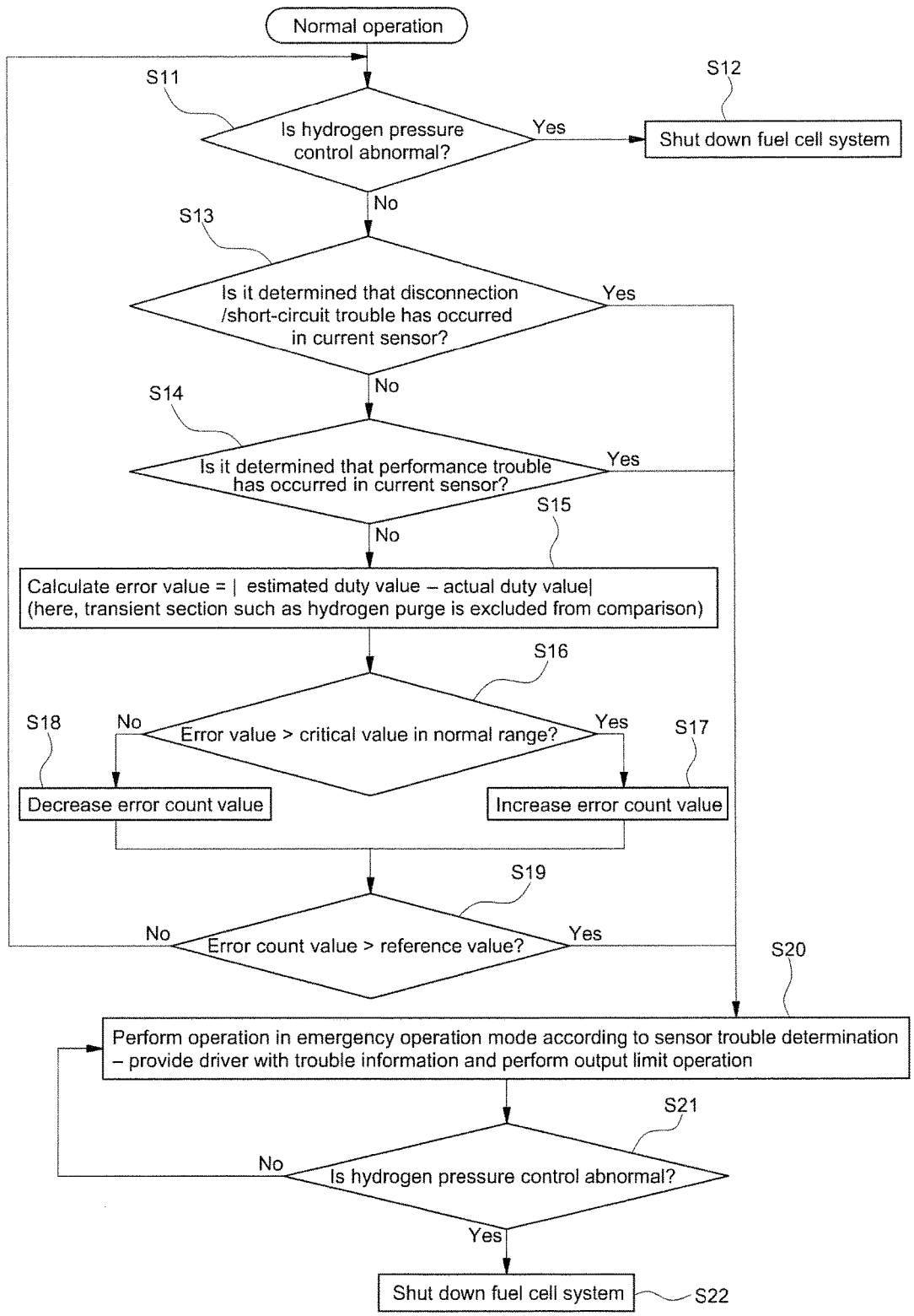
FIG. 10 is a flowchart illustrating a process of diagnosing a failure of a current sensor according to the present disclosure.

FIG. 10 is a flowchart illustrating a failure diagnosis process according to an embodiment of the present inventive concept. A process of diagnosing a failure of the current sensor will be described with reference to FIG. 10.

First, the controller identifies whether hydrogen pressure control is performed normally from a sensing value of the pressure sensor (S11). Here, the controller identifies a hydrogen over-pressure state in which the sensing value of the pressure sensor is high as compared with a normal pressure range according to operating conditions of the fuel cell stack, a hydrogen low-pressure state in which the sensing value of the pressure sensor is low as compared with the normal pressure range, and the like.

If it is determined that the hydrogen pressure control according to the operating conditions of the fuel cell stack is performed abnormally such as the hydrogen over-pressure state or the hydrogen low-pressure state, the controller shuts down the fuel cell system (S12).

On the other hand, if the hydrogen pressure control is performed normally, the hydrogen pressure control valve is driven normally. In this state, the controller performs a process of diagnosing a failure of the current sensor.

In the process of diagnosing a failure of the current sensor, the controller diagnoses a disconnection failure, a short-circuit failure, or a performance failure according to an ordinary failure diagnosis logic (S13 and S14). The process of diagnosing the disconnection failure, the short-circuit failure or the performance failure is not different from the conventional diagnosis process, and therefore, the description thereof will be omitted.

When it is determined the disconnection failure, the short-circuit failure, or the performance failure occurs, the controller operates a warning device to warn a driver of the failure of the current sensor, and performs an operation of the fuel cell system in an emergency operation mode in which an output of the fuel cell stack is limited (S20).

When it is determined that the disconnection failure, the short-circuit failure or the performance failure does not occur in the process described above, the controller compares a duty value of the hydrogen pressure control valve, which is estimated from a sensing value of the current sensor with a real-time duty value where the hydrogen pressure control value is actually controlled, thereby evaluating a difference value (error value) between the duty value and the real-time duty value (S15). The controller identifies whether the error value is beyond a predetermined allowance range (S16).

That is, the controller evaluates, from the duty map, an estimated duty value corresponding to the sensing value of the current sensor, and compares the estimated duty value with an actual duty value, thereby evaluating the error value between the estimated duty value and the actual duty value. Then, the controller compares the error value with a critical value in a predetermined normal range. When the error value exceeds the critical value, the controller increases an error count value by 1 (S17).

Subsequently, the controller calculates the estimated duty value every predetermined period, calculates the error value between the estimated duty value and the actual duty value, and compares the error value with the critical value. Accordingly, whenever the error value exceeds the critical value, the controller increases the error count value by 1. Whenever the error value is not more than the critical value, the controller decreases the error count value in a previous period by 1 (S18).

If the accumulated error count value exceeds a predetermined reference value, the controller diagnoses that a failure has occurred in the current sensor (S19). Similar to the disconnection failure, the short-circuit failure, or the performance failure, the controller operates the fuel cell system in the emergency operation mode (S20).

If the hydrogen pressure control is performed abnormally while the fuel cell system operates in the emergency operation mode due to the failure of the current sensor (S21), the controller immediately shuts down the fuel cell system (S22).

The method for diagnosing a failure of the current sensor according to the present disclosure has been described.

Hence, the failure diagnosis process of the present disclosure is not performed when the pressure of hydrogen is changed regardless of stack current consumption, for example, when the hydrogen purge value is open.

In the description of the embodiment, it has been described that the estimated duty value according to the sensing value of the current sensor is calculated from the duty map (current Vs duty map). However, the failure diagnosis process may be configured that an estimated current value corresponding to the actual duty value is evaluated from a current map (duty Vs current map) (estimation of a current value), and if the error value between the estimated current value and an actual sensing value of the current sensor is beyond a normal range by comparing the estimated current value with the actual sensing value of the current sensor, it is determined that a failure has occurred in the current sensor.

The current map may be made by evaluating, for each duty value of the hydrogen pressure control valve, the sensing value (stack current value) of the normal current sensor without any failure in fuel cell systems having the same specification and then setting a current value corresponding to the duty value.

According to the method of the present disclosure, it is possible to diagnosis a failure of the current sensor using a duty value of the hydrogen pressure control valve in the failure diagnosis impossible region of the existing current sensor, in addition to the disconnection failure, the short-circuit failure, and the performance failure. In addition, it is possible to prevent a malfunction of the fuel cell system and improve stability of the fuel cell system.

Further, it is possible to perform an emergency operation without shutting down the fuel cell system even when a failure occurs in the current sensor.

The inventive concept has been described in detail with reference to exemplary embodiments thereof. However, it will be appreciated by those skilled in the art that changes may be made in these embodiments without departing from the principles and spirit of the disclosure, the scope of which is defined in the appended claims and their equivalents.

What is claimed is:

1. A method for diagnosing a current sensor of a fuel cell system, the method comprising steps of:
    (a) calculating an estimated duty value of a hydrogen pressure control valve, the estimated duty value corresponding to a sensing value of the current sensor, when operating the fuel cell system;
    (b) comparing the estimated duty value with an actual duty value in which the hydrogen pressure control valve is controlled during the operation of the fuel cell system and calculating an error value between the estimated duty value and the actual duty value; and
    (c) comparing the error value with a critical value in a normal range and determining whether a failure occurs in the current sensor,
    wherein the hydrogen pressure control valve controls a pressure of hydrogen supplied to a fuel cell stack of the fuel cell system.

2. The method of claim 1, wherein the estimated duty value is evaluated from a duty map in which a duty value is set according to the sensing value of the current sensor, and
    wherein the duty map is made by previously evaluating the duty value for each sensing value of the current sensor which operates normally during the operation of the fuel cell system.

3. The method of claim 1, wherein the estimated duty value is evaluated from a relational expression between the sensing value of the current sensor and a duty value, and wherein the relational expression is obtained by previously evaluating duty value data of the hydrogen pressure control valve for each sensing value of the current sensor, which operates normally during operation of the fuel cell system.

4. The method of claim 1, wherein, in step (c), when the error value between the estimated duty value and the actual duty value exceeds the critical value in the normal range, an error count value increases by 1, and wherein it is determined that the failure occurs in the current sensor, when the error count value, which is accumulated by periodically repeating the calculation of the estimated duty value, the calculation of the error value, and the comparison of the error value with the critical value, exceeds a reference value.

5. The method of claim 4, wherein the calculation of the estimated duty value, the calculation of the error value, and the comparison of the error value repeat periodically, and wherein when the error value is equal to or less than the critical value, an error count value is subtracted by 1.

6. The method of claim 1, wherein when the failure occurs in the current sensor, a warning device generates failure information to a driver, and the fuel cell system operates in an emergency mode in which the fuel cell stack generates a limited output.

7. The method of claim 1, wherein steps (a), (b), and (c) are performed when the hydrogen pressure control is performed normally by identifying whether a sensing value of a pressure sensor for detecting the pressure of the hydrogen which is supplied to the fuel cell stack is within the normal range according to operating conditions of the fuel cell stack.

8. A method for diagnosing a current sensor of a fuel cell system, the method comprising steps of:

(a') calculating an estimated current sensor value corresponding to a duty value in which a hydrogen pressure control valve is controlled while operating the fuel cell system;

(b') comparing the estimated current sensor value with an actual sensing value which is sensed by the current sensor during the operation of the fuel cell system, and calculating an error value between the estimated current sensor value and the actual sensing value; and (c') comparing the error value with a critical value in a normal range, and determining whether a failure occurs in the current sensor, wherein the hydrogen pressure control valve controls a pressure of hydrogen supplied to a fuel cell stack of the fuel cell system.

9. The method of claim 8, wherein the estimated current sensor value is evaluated from a current map in which a current sensor value is set according to the duty value of the hydrogen pressure control valve, and wherein the current map is made by previously evaluating the actual sensing value of the current sensor, which operates normally, during the operation of the fuel cell system according to the duty value.

10. The method of claim 8, wherein the estimated current sensor value is evaluated from a relational expression between the duty value and the current sensor value, and wherein the relational expression is obtained by previously evaluating the actual sensing value of the current sensor, which operates normally, during the operation of the fuel cell system according to the duty value of the hydrogen pressure control valve.

11. The method of claim 8, wherein, in step (C), when the error value exceeds the critical value in the normal range, an error count value increases by 1; and wherein, when the error count value, which is accumulated by repeating the calculation of the estimated current sensor value periodically, the calculation of the error value, and the comparison of the error value with the critical value, exceeds a reference value, the failure occurs in the current sensor.

12. The method of claim 11, wherein the calculation of the estimated current sensor value, the calculation of the error value, and the comparison of the error value repeat periodically, and wherein when the error value is equal to or smaller than the critical value, the error count value is subtracted by 1.

13. The method of claim 8, wherein, when it is determined that the failure occurs in the current sensor, a warning device generates failure information to a driver, and the fuel cell system operates in an emergency mode in which the fuel cell stack generates a limited output.

14. The method of claim 8, wherein steps (a'), (b'), and (c') are performed when the hydrogen pressure control is performed normally by identifying whether a sensing value of a pressure sensor for detecting the pressure of the hydrogen which is supplied to the fuel cell stack within the normal range according to operating conditions of the fuel cell stack.

* * * * *